United States Patent [19]
Lee et al.

[11] Patent Number: 5,670,400
[45] Date of Patent: Sep. 23, 1997

[54] METHOD FOR MAKING DUAL GATE INSULATING FILM WITHOUT EDGE-THINNING

[75] Inventors: Joo-Hyung Lee, Seoul; Ju-Bum Lee, Osan; Jae-Hyung Lee, Suwon, all of Rep. of Korea

[73] Assignee: Samsung Electronics Co., Ltd., Suwon, Rep. of Korea

[21] Appl. No.: 575,876

[22] Filed: Dec. 21, 1995

[30] Foreign Application Priority Data

Dec. 21, 1994 [KR] Rep. of Korea ............... 94-35625

[51] Int. Cl.⁶ .................................. H01L 21/786
[52] U.S. Cl. .................. 437/40 TFT; 437/41 TFT; 437/238; 437/247
[58] Field of Search ............ 437/40 TFT, 41 TFT, 437/247, 913, 238, 101; 148/DIG. 150, DIG. 1

[56] References Cited

U.S. PATENT DOCUMENTS

| | | | |
|---|---|---|---|
| 4,597,160 | 7/1986 | Ipri | 437/41 TFT |
| 5,064,775 | 11/1991 | Chang | 437/40 TFT |
| 5,395,804 | 3/1995 | Ueda | 437/40 TFT |
| 5,504,019 | 4/1996 | Miyasaka et al. | 437/247 |

FOREIGN PATENT DOCUMENTS

| | | | |
|---|---|---|---|
| 4233777 | 4/1993 | Germany | 437/247 |
| 1147869 | 6/1989 | Japan | 437/34 |

*Primary Examiner*—Michael Trinh
*Attorney, Agent, or Firm*—Cushman Darby & Cushman, IP Group of Pillsbury Madison & Sutro LLP

[57] ABSTRACT

A dual gate insulating film of a thin film transistor (TFT) is disclosed in which edge-thinning is eliminated by forming a thermal oxide film after depositing an oxide film by a low temperature chemical vapor deposition (CVD) method. According to the disclosed dual gate insulating film and method for making the same, exposure of gate material on edges of the gate film is prevented, grooving of the active pattern of polycrystalline silicon is reduced, and the same electric and insulating characteristics as those of the conventional thermal oxide film are obtained.

8 Claims, 4 Drawing Sheets

5,670,400

METHOD FOR MAKING DUAL GATE INSULATING FILM WITHOUT EDGE-THINNING

BACKGROUND OF THE INVENTION (1) Field of the Invention

This invention relates to a dual gate insulating film without edge-thinning and a method for making the same. More particularly, it relates to a dual gate insulating film formed in the manufacture of a thin film transistor (TFT) in which edge-thinning of the film through which gate material can be exposed is eliminated.

(2) Description of the Related Art

Display devices are known as important devices for transferring information. Consequently, various alternatives to the cathode-ray tube have been developed. One alternative to the cathode-ray tube is the flat panel display.

Among flat panel display devices, the liquid crystal display is relatively light-weight, thin, and suitable for being matched to integrated circuits. Moreover, liquid crystal displays advantageously have low production costs and low power consumption. Thus, such displays are used in many environments, from loading vehicles to displaying color television, in addition to their traditional use as display devices for laptop and pocket computers.

In order to drive the liquid crystal display by an active matrix method, a thin film transistor (TFT) liquid crystal display is used. Generally, in the process of manufacturing a high-temperature TFT liquid crystal display, a gate insulating film is formed by performing thermal oxidation after patterning an active layer on a glass substrate.

As illustrated in FIG. 1, the conventional gate insulating film 5 is formed on an active pattern 2 by thermal oxidation. The active pattern 2 is formed from a layer of amorphous silicon deposited on substrate 1.

In the process of manufacturing the conventional gate insulating film, there may arise problems like edge-thinning, indicated by region 9 in FIG. 1, wherein a portion of gate material is exposed at an edge of the gate insulating film 5. This disadvantageous feature adversely affects the reliability of the TFT liquid crystal display panel manufactured using the conventional gate insulating film.

In order to solve these problems, a method for depositing an oxide film by a chemical vapor deposition (CVD) method was disclosed in a 1993 ASID article entitled "Gate Insulating Film's Effect on High-Temperature Polycrystalline Silicon Thin Film Transistor." A structure according to this method is illustrated in FIG. 2. In this method, as in the conventional method, a thermal oxide film 4 is formed on an active pattern 2 formed from a layer of amorphous silicon deposited on substrate 1. Next, an additional layer of oxide film 6 is deposited by a CVD method.

However, the insulation internal resistance and leakage current characteristics of the CVD-deposited oxide film 6 are inferior to those of the conventional thermal oxide film. Furthermore, a surface trap created between the thermal oxide film 4 and an oxide film 6 adversely affects the characteristics of the resulting device.

In addition, since a negative edge profile is already formed after the initial thermal oxidation, the CVD-deposited oxide film also encroaches the edge of the active pattern and exhibits the same problem of edge-thinning, as indicated by region 9 illustrated in FIG. 2.

Another drawback inherent in these conventional methods is illustrated in FIG. 3. When a high-temperature thermal oxide film is formed on an active pattern of amorphous silicon 2, the amorphous silicon becomes a polycrystalline silicon having a grain boundary 7. Along the grain boundary of polycrystalline silicon created at that time, a thermal oxidation progresses more rapidly than in other portions of the polycrystalline silicon, such that deep grooving occurs in the boundary portions of the polycrystalline silicon, as shown by reference numeral 8 in FIG. 3A.

SUMMARY OF THE INVENTION

Accordingly, it is an object of the present invention to provide a dual gate insulating film and a method for making the same which overcomes the drawbacks of the conventional structures, including edge-thinning.

According to the present invention, by performing thermal oxidation after depositing a low-temperature chemical vapor deposition oxide film, a dual gate insulating film having the same electric and insulating features as those of the conventional thermal oxide film is obtained, but in which edge-thinning is eliminated, and grooving of the polycrystalline silicon is reduced.

In order to achieve the above objects, the TFT structure including a dual gate insulating film formed according to the present invention includes a glass substrate, an active pattern of polycrystalline silicon formed on the glass substrate, a thermal oxide film formed on the active pattern, and an oxide film formed by a chemical vapor deposition method prior to a thermal treatment process.

According to another aspect of the present invention, a method for making a TFT structure including a dual gate insulating film having the advantages of the present invention includes the steps of forming an active pattern from amorphous silicon layer deposited on a glass substrate, forming an oxide film by a low-temperature chemical vapor deposition method after forming the active pattern, and forming a thermal oxide film after forming the low-temperature oxide film.

DETAILED DESCRIPTION OF THE PREFERRED EMBODIMENT

A preferred embodiment of the present invention will be described in detail with reference to the accompanying drawings.

Figure 5:
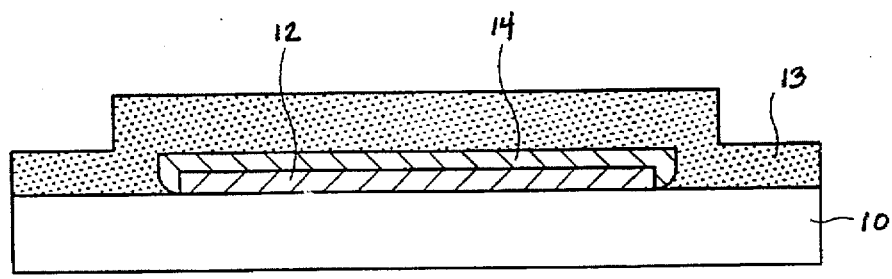
FIG. 5 is a sectional view of the dual gate insulating film without edge-thinning formed according to the preferred embodiment of this invention.

As illustrated in FIG. 5, a TFT gate structure including a dual gate insulating film without edge-thinning formed according to the preferred embodiment includes an active pattern of polycrystalline silicon 12 formed on a glass substrate 10, a thermal oxide film 14 formed over the active pattern 12, and an oxide film 13 formed by a CVD method prior to a thermal treatment process for forming the thermal oxide film 14.

Figure 1:
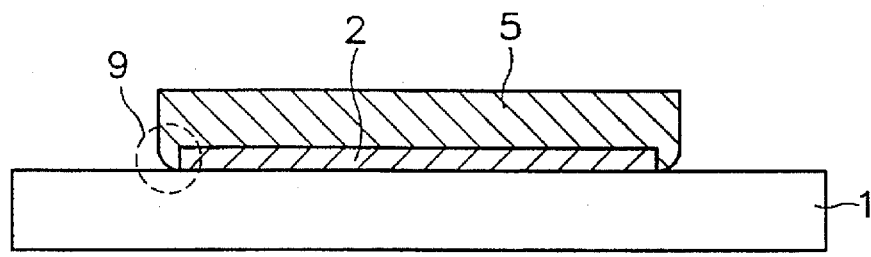
FIG. 1 is a sectional view of a conventional gate insulating film.
Figure 2:
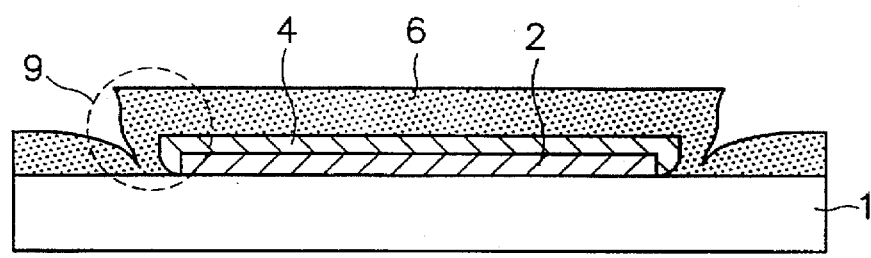
FIG. 2 is a sectional view of the conventional gate insulating film formed by depositing the oxide film by a chemical vapor deposition method after conventional thermal oxidation.
Figure 3:
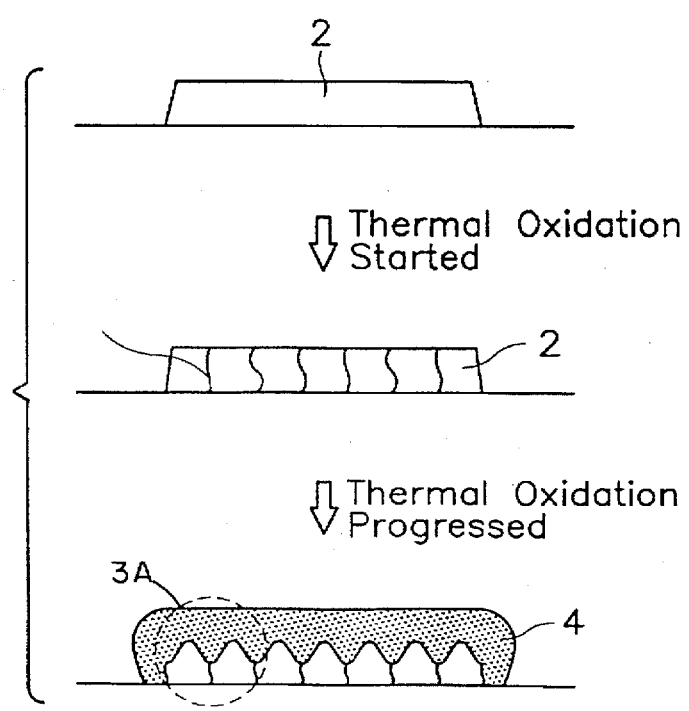
FIG. 3 is a sectional view showing the steps wherein grooving is created in the polycrystalline silicon active pattern during the process of forming the conventional gate insulating film.
Figure 3A:
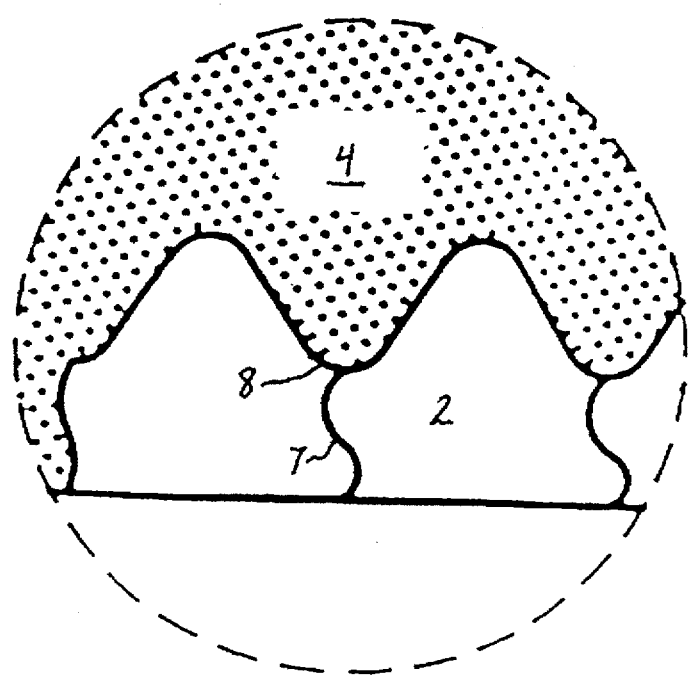
FIG. 3A is an exploded view of the grooving created during the process of forming the conventional gate insulating film illustrated in FIG. 3.
Figure 6A:
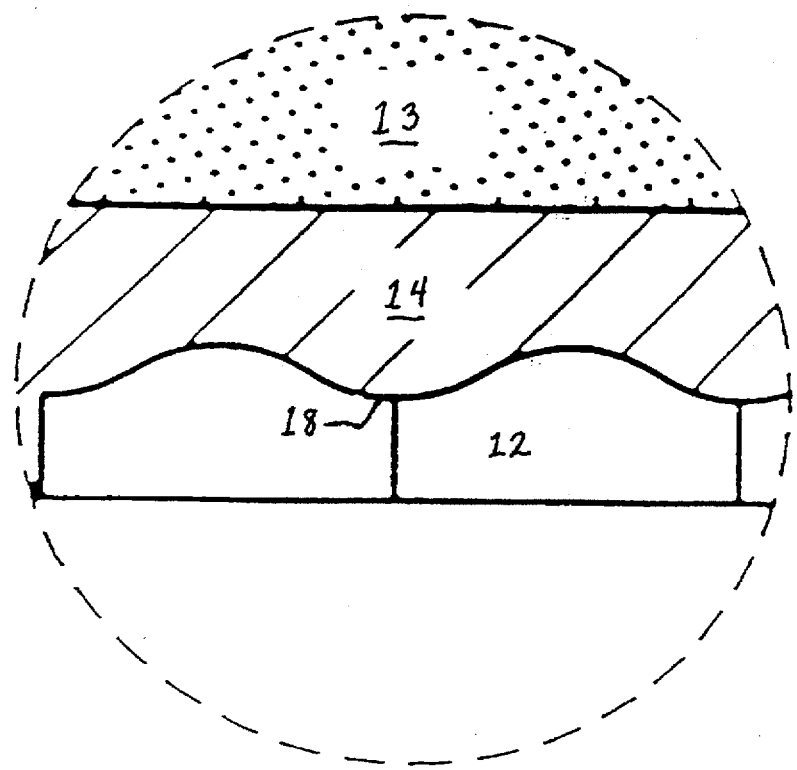
FIG. 6A is an exploded view of the reduced grooving obtained during the process of forming the gate insulating film according to the preferred embodiment as illustrated in FIG. 6.
Figure 6:
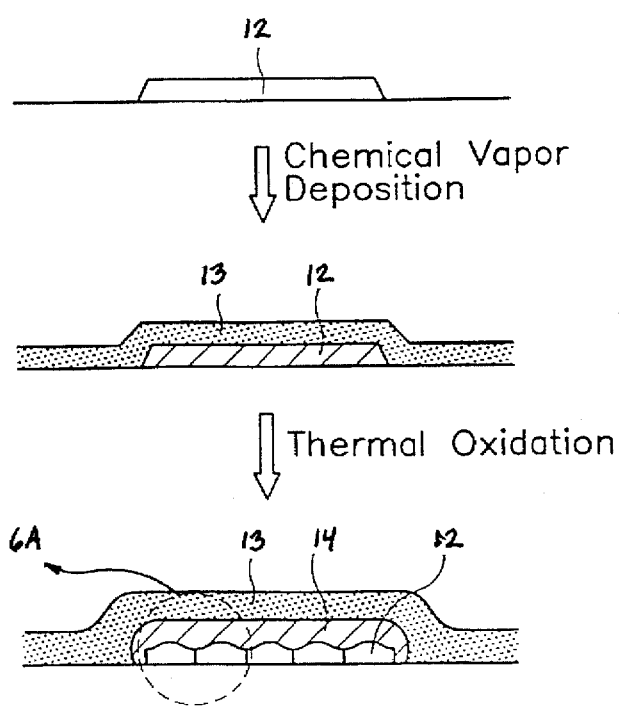
FIG. 6 is a sectional view showing the steps wherein grooving in the polycrystalline silicon active pattern is reduced by the process of forming the dual gate insulating film according to the preferred embodiment.

The method for making the dual gate insulating film without edge-thinning according to the present invention will now be described with reference to FIGS. 4 to 6.

Figure 4:
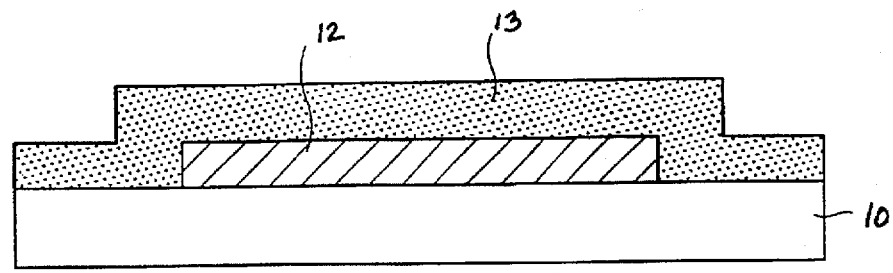
FIG. 4 is a sectional view showing the step of forming the low-temperature oxide film before the formation of the dual gate insulating film according to a preferred embodiment of this invention.

As illustrated in FIG. 4, an active pattern 12 of silicon is formed after a layer of amorphous silicon (not shown) is deposited on the substrate 10. The process of depositing the amorphous silicon and forming the active pattern of silicon is known in the art. Accordingly, a detailed description of this step will be omitted here.

Over the active pattern 12, an oxide film 13 is formed to a thickness of 500 angstroms by a low-temperature chemical vapor deposition method such as APCVD, PECVD, LTO, and ECR-CVD. The deposition of the oxide film 13 at a low temperature serves to prevent neucleation of the active pattern 12 when the oxide film is deposited. When depositing oxide film at high temperatures, neucleation prevents grain growth during the process of forming the thermal oxide film.

Next, the thermal oxide film 14 is formed to a thickness of about 200 angstroms to 600 angstroms, preferably 500 angstroms. Both the thermal oxide film 14 and the above low-temperature oxide film 13 are formed to a minimum combined thickness sufficient to endure the maximum insulation internal resistance of the device. Preferably, the thermal oxide film 14 and the low-temperature oxide film 13 are formed to a combined thickness of 1000 angstroms to 1200 angstroms.

When the thermal oxide film 14 is formed, the amorphous silicon of active pattern 12 is transformed into polycrystalline silicon. Also, with the thermal oxide film 14 formed over the whole surface of the active pattern 12 and low-temperature oxide film 13 formed before, desirable surface characteristics can be obtained.

In addition, by performing thermal oxidation after the formation of the low temperature oxide film 13, densification and dehydrogenation of the low temperature oxide film occur. Accordingly, the electric and insulating characteristics of oxide film 13 become identical to those of a conventional thermal oxide film. Moreover, through the process of forming the thermal oxide film 14, the surface trap between the oxide film 13 and the thermal oxide film 14 is removed and the stress between the thin films is released. This ensures stability of the films.

Most notably, by forming the gate insulating film according to these processes, edge-thinning is totally eliminated. Thus, gate material is not exposed at the edges of the active pattern after the gate film is formed and patterned, and the reliability of the structure is improved. Furthermore, smaller thicknesses of oxide film formed by the process illustrated in FIG. 6 result in the grooves 18 in the polycrystalline silicon 12 which are correspondingly less pronounced, as illustrated in FIG. 6A, even though the uneven progression inherent in thermal oxidation into the polycrystalline silicon 12 still occurs.

The results obtained by testing the dual gate insulating film manufactured according to the following condition are illustrated in Tables 1 and 2 below.

Condition: An amorphous silicon is deposited to a thickness of 600 angstroms (at 560 degrees centigrade, $SiH_4+H_2$) and an active pattern is formed. Next, oxide (PEOX) formed by a plasma enhanced chemical vapor deposition (PECVD) is deposited to a thickness of 600 angstroms ($SiH_4$ 25 sccm+$N_2O$ 1100 sccm: at 400 degrees Centigrade) and the thermal oxide film is formed to 500 angstroms (at 1050 degrees Centigrade), simultaneously with the crystallization of the amorphous silicon.

TABLE 1

| | C-V Characteristics | | | | |
|---|---|---|---|---|---|
| | Thickness (Å) | Refractive Index (R, I) | Surface Charge Density (Qit(1E11)) | Flat-Band Voltage (vfb(V)) | Threshold Voltage (Vth(V)) |
| Thermal Oidde Film | 1002 | 1.466 | 1.56 | −1.60 | −0.37 |
| PEOX/ Thermal Oxide Film | 995.5 | 1.467 | 1.63 | −1.59 | −0.30 |

TABLE 2

| | I-V Characteristics | |
|---|---|---|
| | Gate Voltage (Vg(V)) When Leakage Current 200 nA | Breakdown Voltage (Vbr(V)) |
| Thermal Oxide Film | 86.9 | 88 |
| PEOX/Thermal Oxide Film | 85.6 | 87 |

Figure 7:
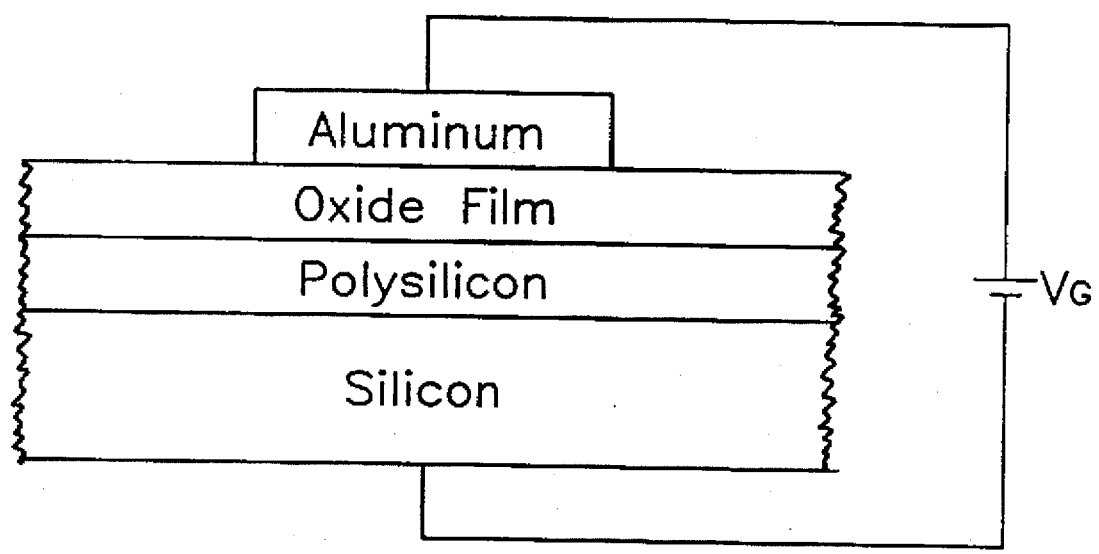
FIG. 7 is a circuit diagram illustrating the method used to test the characteristics of the dual gate insulating film formed according to the preferred embodiment.

In addition, the results obtained by testing a thin-film transistor having the gate insulating film formed according to the present invention as illustrated in FIG. 7 are given below in Table 3.

TABLE 3

| | Leakage Current When Vg = 10 V | Insulating Internal Pressure (Vbr) |
|---|---|---|
| Thermal Oxide Film of 500 Å | 11.75 nA | 24 V |
| Thermal Oxide Film of 300 Å + CVD 200 Å | 0.64 nA | 41.8 V |

As mentioned above, the dual gate insulating film and method for making the same according to the present invention exhibits the same electric and insulating characteristics as those of the conventional thermal oxide film. However, the resulting gate film is free of edge-thinning and results in less grooving of the polycrystalline silicon active pattern. These advantages are achieved by capitalizing on the beneficial effects of densification and dehydrogenation in an oxide film formed by a CVD method which are obtained by performing the step of thermal oxidation after depositing the oxide film.

While the present invention has been discussed with reference to the preferred embodiment, it will be recognized that various modifications and substitutions can be made thereto without departing from the spirit and scope of the claims set forth below.

What is claimed is:

1. A method for forming a thin film transistor structure, comprising the steps of:

forming an active pattern of amorphous silicon on a portion of a substrate;

forming an insulating layer by first forming an oxide film on said active pattern of amorphous silicon and then growing a thermal oxide film so that a portion of said active pattern of amorphous silicon becomes said thermal oxide film, said growing step being controlled such that said amorphous silicon is transformed to polycrystalline silicon and said thermal oxide film totally encloses side and top edges of said active pattern.

2. A method according to claim 1, wherein said step of forming said oxide film includes depositing said oxide film by a chemical vapor deposition method.

3. A method according to claim 1, wherein said steps of forming said oxide film and growing said thermal oxide film are controlled such that said oxide film and said thermal oxide film are formed to a combined thickness of 1000 angstroms to 1200 angstroms.

4. A method according to claim 1, wherein said step of growing said thermal oxide film includes forming said thermal oxide film to a thickness of 200 angstroms to 600 angstroms.

5. A method according to claim 2, wherein said chemical vapor deposition is performed at a low temperature of substantially 400° C.

6. A method according to claim 1, wherein said growing step is controlled such that densification and dehydrogenation of said oxide film occurs.

7. A method according to claim 1, wherein said growing step is controlled such that there exists substantially no surface trap between said oxide film and said thermal oxide film.

8. A method according to claim 1, wherein said step of forming said oxide film is controlled so as to prevent nucleation of said active pattern.

* * * * *